United States Patent
Hirai et al.

(10) Patent No.: US 6,657,266 B2
(45) Date of Patent: Dec. 2, 2003

(54) SEMICONDUCTOR SWITCHING DEVICE

(75) Inventors: Toshikazu Hirai, Ora-gun (JP); Tetsuro Asano, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/073,364

(22) Filed: Feb. 13, 2002

(65) Prior Publication Data

US 2002/0117696 A1 Aug. 29, 2002

(30) Foreign Application Priority Data

Feb. 27, 2001 (JP) ........................................ 2001-051862
Feb. 27, 2001 (JP) ........................................ 2001-051863

(51) Int. Cl.[7] .................. H01L 29/732; H01L 31/0328; H01L 31/0336; H01L 31/1072; H01L 31/109; H01L 29/735; H01L 29/76; H01L 29/94; H01L 31/113; H01L 31/119; H03K 3/3561

(52) U.S. Cl. ...................... 257/393; 257/183; 257/187; 327/208; 327/581

(58) Field of Search ................. 257/280, 256, 257/491, 499, 678, 723, 724, 393, 282, 27, 73, 192, 260, 281, 459, 734, 779, 20, 24, 210, 590, 57, 360, 71, 357, 133, 358, 138, 183, 187, 213, 267, 270; 327/208, 581; 438/167, 135, 570, 149, 151, 157, 166, 193, 195, 284, 385, 590; 455/83, 78, 575

(56) References Cited

U.S. PATENT DOCUMENTS

| | | | | |
|---|---|---|---|---|
| 4,810,911 A | * | 3/1989 | Noguchi | 327/431 |
| 5,350,957 A | * | 9/1994 | Cooper et al. | 327/427 |
| 5,497,118 A | * | 3/1996 | Ueno et al. | 327/416 |
| 2002/0118044 A1 | * | 8/2002 | Hirai et al. | 327/365 |

* cited by examiner

*Primary Examiner*—Nathan J. Flynn
*Assistant Examiner*—Victor A. Mandala, Jr.
(74) *Attorney, Agent, or Firm*—Morrison & Foerster LLP

(57) ABSTRACT

A switching circuit device has a first FET and a second FET, and operates with single control terminal. The device also has a common input terminal connected to the drain or source electrode of the two FETs, a first output terminal and a second output terminal connected to the source or the drain electrode of the respective FET, a bias element applying an bias to the first output terminal, a first connection connecting the control terminal to the second FET, a second connection connecting the gate of the second FET to the ground, and a direct current isolation element placed between the two FETs. The device is housed in a MCP6 package with six pins.

26 Claims, 9 Drawing Sheets

PRIOR ART

SEMICONDUCTOR SWITCHING DEVICE

BACKGROUND OF THE INVENTION

1. Field of the Invention

The invention relates to a semiconductor switching device for switching at high frequencies, especially to a compound semiconductor switching device operating with only one control terminal.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) made on a gallium arsenide (GaAs) substrate, as this material is suitable for use at high frequencies, and developments have been made in forming a monolithic microwave integrated circuit (MMIC) by integrating the aforementioned switching circuits.

FIG. 1A is a cross-sectional view of a conventional GaAs metal-semiconductor field-effect transistor (MESFET). The GaAs substrate 1 is initially without doping, and has beneath its surface an n-type channel region (or a channel layer) 2 formed by doping with n-type dopants. A gate electrode 3 is placed on the surface of the channel region 2, forming a Schottky contact, and a source electrode 4 and a drain electrode 5 are placed on both sides of the gate electrode 3, forming ohmic contacts to the surface of the channel region 2. In this transistor configuration, a voltage applied to the gate electrode 3 creates a depletion layer within the channel region 2 beneath the gate electrode 3 and thus controls the channel current between the source electrode 4 and the drain electrode 5.

FIG. 1B shows the basic circuit configuration of a conventional compound semiconductor switching device called a SPDT (Single Pole Double Throw) switch, using GaAs FETs. The source electrode (or the drain electrode) of each FET (FET1 and FET2) is connected to a common input terminal IN. The drain electrode (or source electrode) of each FET (FET1 and FET2) is connected to respective output terminals (OUT1 and OUT2). The gates of FET1 and FET2 are connected to the control terminals Ctl-1, Ctl-2 through resistors R1, R2, respectively. A pair of complementary signals is applied to the two control terminals, Ctl-1, Ctl-2. When a high level signal is applied to the control terminal of one of the FETs, the FET changes to an on-state, and a signal fed to the common input terminal IN passes through the FET and reaches one of the output terminals OUT1, OUT2. The role of the resistors R1 and R2 is to prevent the leaking of the high frequency signals through the gate electrodes to the DC voltages applied to the control terminals Ctl-1, Ctl-2, which are substantially grounded at high frequency.

The conventional compound semiconductor switching device described above is configured so that one of the pair of complementary signal is applied to the gate of FET1 via the control terminal Ctl-1 and resistor R1 and other of the pair of complementary signal is applied to the gate of FET2 via the control terminal Ctl-2 and resistor R2. Accordingly, two signals, which forms a complementary signal pair, need to be fed to the two control terminals Ctl-1, Ctl-2. Such a configuration needs two external electrodes for the two control terminals Ctl-1, Ctl-2 when the device is housed in a package, resulting in a large package size. Although it is possible to eliminate one control terminal by introducing an inverter circuit to the switching device, this design requires additional FETs, resulting higher energy consumption and a larger package size.

Furthermore, the conventional GaAs MESFET is a depletion type FET and requires the application of a negative voltage for its operation. Therefore, the conventional compound semiconductor switching device described above requires a negative voltage generating circuit for its operation.

SUMMARY OF THE INVENTION

This invention provides a switching circuit device including a common input terminal pad, a first output terminal pad and a second output terminal pad, a first switching element connected to the common input terminal pad and the first output terminal pad, a second switching element connected to the common input terminal pad and the second output terminal pad, and a control terminal pad connected to the first switching element and receiving a control signal for the switching device. The device also includes a first connection connecting the control terminal pad to the second switching element, a second connection connecting the second switching element to a ground, a ground terminal pad for the second connection, a direct current isolation element interrupting a direct current between the second switching element and the common input terminal pad, and a bias element applying a bias voltage to the first switching element.

The invention also provides a semiconductor switching device including a first field effect transistor and a second field effect transistor, each comprising a source electrode, a gate electrode and a drain electrode which are formed on a channel layer of the respective transistor, a common input terminal pad connected to the source electrode or the drain electrode of the first transistor and connected to the source electrode or the drain electrode of the second transistor, a first output terminal pad connected to the source electrode or the drain electrode of the first transistor which is not connected to the common input terminal pad, a second output terminal pad connected to the source electrode or the drain electrode of the second transistor which is not connected to the common input terminal pad, and a control terminal pad connected to the first transistor and the second transistor. The device also includes a first connection connecting the control terminal pad to the second transistor, a second connection connecting the gate electrode of the second transistor to a ground, a ground terminal pad for the second connection, an external direct current isolation element interrupting a direct current between the second transistor and the common input terminal pad, an isolation terminal pad for the external direct current isolation element, and a bias element applying a bias voltage to the first transistor. In this device, the first transistor and the second transistor are integrated into a chip. The isolation terminal pad, the common input terminal pad and the control terminal pad are disposed along one edge of the chip, and the first output terminal pad, the second output terminal pad and the ground terminal pad are disposed along another edge of the chip opposite to the edge with the isolation terminal pad, the common input terminal pad and the control terminal pad so that the ground terminal pad is located between the two output terminal pads.

The invention further provides a semiconductor switching device including a first field effect transistor and a second field effect transistor each comprising a source electrode, a gate electrode and a drain electrode which are formed on a channel layer of the respective transistor, a common input terminal pad connected to the source electrode or the drain electrode of the first transistor and connected to the source electrode or the drain electrode of the second transistor, a first output terminal pad connected to the source electrode or the drain electrode of the first transistor which is not connected to the common input terminal pad, a second output terminal pad connected to the source electrode or the drain electrode of the second transistor which is not connected to the common input terminal pad, and a control terminal pad connected to the gate electrode of the first transistor and receiving a control signal for the switching device. The device also has a first connection connecting the control terminal pad to the source electrode or the drain electrode of the second transistor, a second connection connecting the gate electrode of the second transistor to a ground, a ground terminal pad for the second connection, a direct current isolation element interrupting a direct current between the second transistor and the common input terminal pad, and a bias element applying a bias voltage to the first transistor.

The invention also provides a circuit device which cooperates with an external direct current isolation element and an external bias element to work as a switch. The circuit includes a common input terminal pad, a first output terminal pad and a second output terminal pad, a first switching element connected to the common input terminal pad and the first output terminal pad, a second switching element connected to the common input terminal pad and the second output terminal pad, a control terminal pad connected to the first switching element and receiving a control signal for switching the first transistor and the second transistor. The circuit device also includes a first connection connecting the control terminal pad to the second switching element, a second connection connecting the second switching element to a ground, a ground terminal pad for the second connection, and an isolation terminal pad connected to the second switching element. In this circuit device, the direct current isolation element is connected to the common input terminal pad and the isolation terminal pad, and the bias element is connected to the common input terminal pad or the first output terminal. Either the direct current isolation element or a resistor of the bias element may be integrated into the circuit device.

DETAILED DESCRIPTION OF THE INVENTION

Embodiments of this invention will be described hereinafter with reference to the above drawings.

Figure 1A:
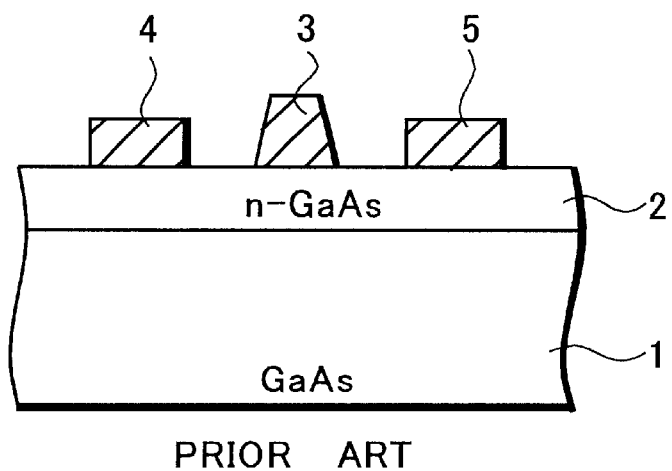
FIG. 1A is a cross-sectional view of a conventional switching device.
Figure 1B:
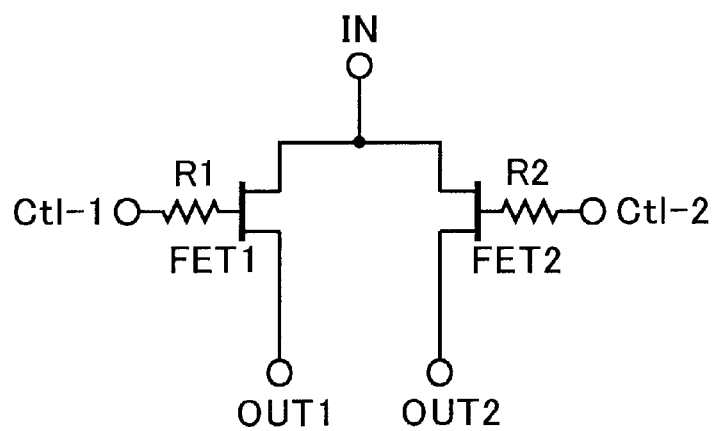
FIG. 1B is a circuit diagram of a conventional SPDT switch.
Figure 2:
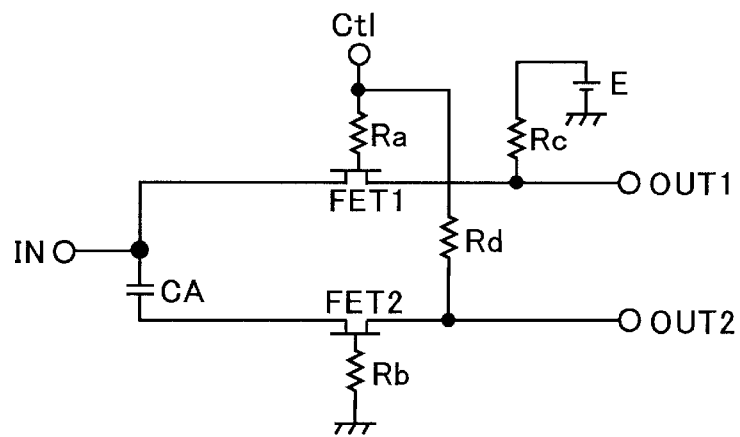
FIG. 2 is a circuit diagram of a semiconductor switching circuit device of a first embodiment of this invention.

FIG. 2 is a circuit diagram of a semiconductor switching circuit device of a first embodiment. The device has first and second FETs (FET1, FET2), each of which has a source electrode, a gate electrode and a drain electrode on its channel layer. The device also has a common input terminal IN connected to the source electrodes (or the drain electrodes) of the FETs (FET1, FET2), a first output terminal connected to the drain electrode (or the source electrode) of the first FET (FET1), a second output terminal connected to the drain electrode (or the source electrode) of the second FET (FET2), and a control terminal Ctl which supplies a control signal to the gate of only FET1. The device further includes a bias element applying a predetermined bias to the output terminal OUT1 of FET1 or to the input terminal IN, a direct current isolation element interrupting a direct current between the source electrode (or the drain electrode) of FET2 and the common input terminal IN, a first connection connecting the control terminal Ctl to the drain electrode (or the source electrode) of FET2, and a second connection connecting the gate electrode of FET2 to the ground. The two FETs are both GaAs MESFET and integrated into a chip, as described later with reference to FIGS. 7A, 7B and 7C.

The bias element, which includes a power source E and resistor Rc, constantly applies a predetermined positive voltage, for example +3 V, to the output terminal OUT1 of the FET1 via resistor Rc. The first connection includes resistor Rd, which connects the control terminal Ctl to the drain electrode (or the source electrode) of FET2. The second connection includes resistor Rb, which connects gate electrode of FET2 so that the gate is always grounded. The isolation element is a capacitor CA, which is inserted between the common input terminal IN and the source electrode (or the drain electrode) of FET2. The isolation element isolates FET1 from FET2 in terms of direct current flow. Only one control terminal Ctl applies a control signal to the gate electrode of FET1 via resistor Ra. The four resistors Ra, Rb, Rc, Rd prevent leaking of high frequency signals from the gate electrodes and may have identical or different values depending on circuit design.

Figure 3:
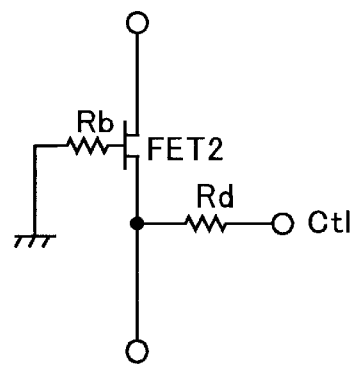
FIG. 3 is circuit diagram of FET2 of the circuit of FIG. 2.
Figure 4:
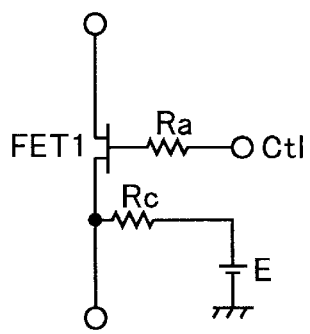
FIG. 4 is circuit diagram of FET1 of the circuit of FIG. 2.

FIGS. 3 and 4 show an operational principle of the switching circuit device of FIG. 2. For a SPDT switching device to operate with a single control terminal configuration, one of the two FETs must turn on while the other turns off under the application of 0 V signal to the single control terminal. The term "0 V" refers to a baseline voltage as well known in the art. Likewise, when a positive signal is applied to the control terminal, the operation states of the two FETs alternate.

FIG. 3 corresponds to FET2 of the circuit of FIG. 2. The gate voltage is kept constant at 0 V because the gate is grounded via resistor Rb. This FET turns on when the voltage applied between its gate and its drain (or source) is equal to the voltage applied between its gate and its source (or drain). In other words, Vg (gate voltage), Vd (drain voltage) and Vs (source voltage) must be the same. Because the gate is grounded (Vg=0 V), the bias condition for turning FET2 on is Vg=Vd=Vs=0 V. On the other hand, FET2 turns off when a voltage sufficient to turn it off is applied between the gate and the drain as well as between the gate and the source. Because the control terminal Ctl is connected to the drain electrode (or the source electrode) of FET2 via resistor Rd, FET2 turns on under an application of 0 voltage to the control terminal Ctl and turns off under an application of a positive voltage, for example +3 V, to the control terminal Ctl.

FIG. 4 corresponds to FET1 of the circuit of FIG. 2. Under an application of 0 V to the control terminal Ctl, FET1 turns off when a voltage sufficient to turn it off is applied between the gate and the drain as well as between the gate and the source. This is achieved by introducing a bias circuit which constantly applies a bias voltage to the drain (or the source) of FET1. On the other hand, FET1 turns on when a voltage equal to the bias voltage is applied to the gate of FET1. Accordingly, FET1 turns off under an application of 0 V to the control terminal Ctl, and turns on under an application of 3 V to the control terminal Ctl.

The circuits of FIGS. 3 and 4 are incorporated into the circuit of FIG. 2 with the capacitor CA isolating the circuit of FIG. 3 from the circuit of FIG. 4 in terms of direct current flow. Interrupting direct current flow between the circuits of FIGS. 3 and 4 prevents interference between the bias conditions of the two circuits.

The features of the circuit of FIG. 2 are as follows:
1) The gate of one of the two FETs (FET2) of the switching device is grounded via resistor Rb.
2) The bias voltage applied to the FET with the grounded gate (FET2) is equal to the voltage applied to the control terminal connected to the gate of the other of the two FETs (FET1).
3) The bias voltage applied to the other FET (FET1) is constant at a predetermined value.
4) The two FETs (FET1 and FET2) are isolated from each other in terms of direct current flow by a capacitor.

Figure 5A:
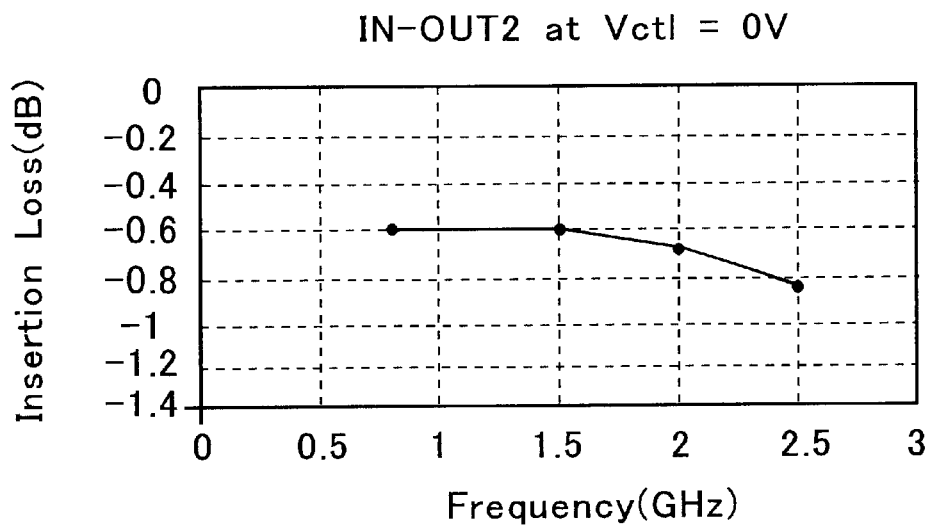
FIGS. 5A and 5B show the insertion loss (FET2) and the isolation (FET1) when 0 V is applied to the control terminal pad.
Figure 5B:
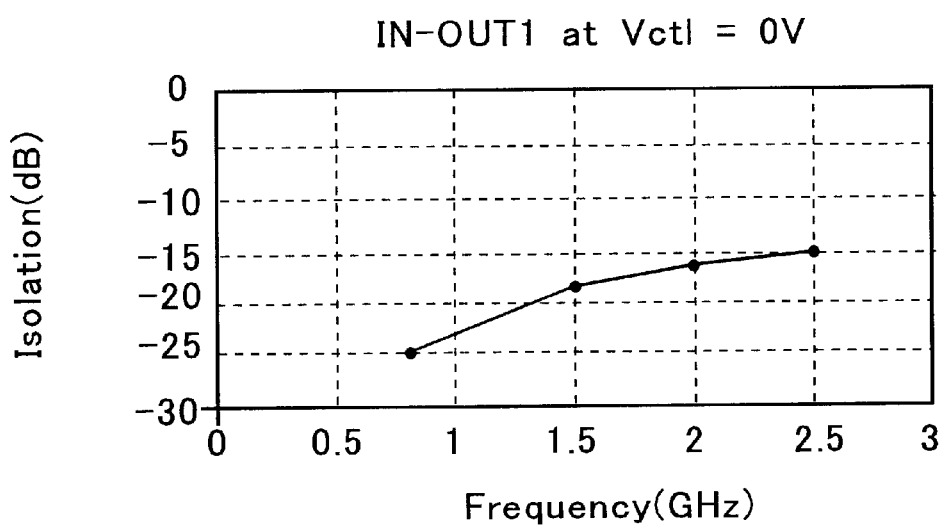

FIGS. 5A, 5B, 6A and 6B summarize the operational characteristics of a switching device based on the circuit of FIG. 2. FIGS. 5A and 5B show the device characteristics when FET2 is on and FET1 is off under an application of 0 V to the control terminal Ctl. The insertion loss between the common input terminal IN and the second output terminal OUT2 is shown in FIG. 5A, and the isolation between the common input terminal IN and the first output terminal OUT1 is shown in FIG. 5B. Both the insertion loss and the isolation are appropriate for the switching operation up to 2.5 GHz.

Figure 6A:
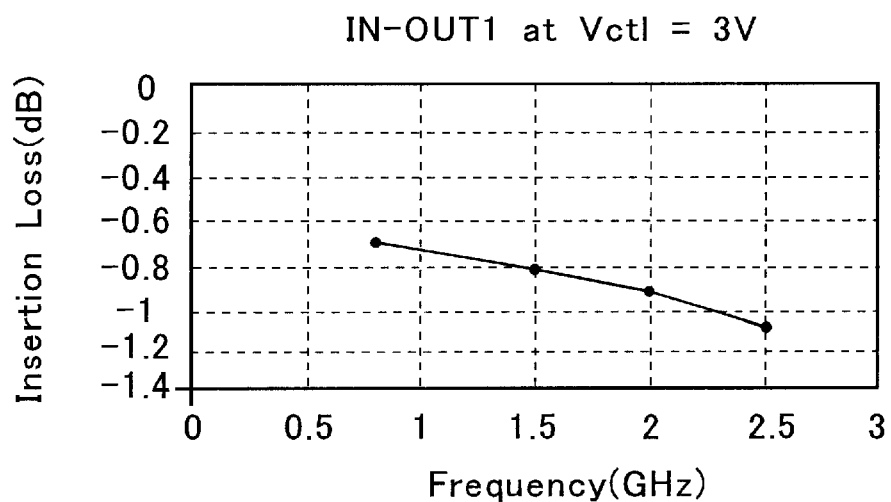
FIGS. 6A and 6B show the insertion loss (FET1) and the isolation (FET2) when 3 V is applied to the control terminal pad.
Figure 6B:
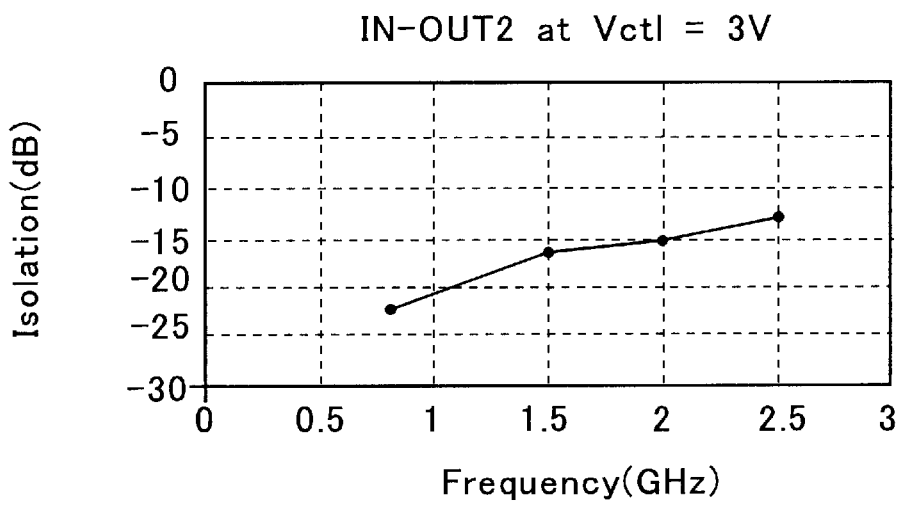

FIGS. 6A and 6B show the device characteristics when FET2 is off and FET1 is on under an application of 3 V to the control terminal Ctl. The insertion loss between the common input terminal IN and the first output terminal OUT1 is shown in FIG. 6A, and the isolation between the common input terminal IN and the second output terminal OUT2 is shown in FIG. 6B. Both the insertion loss and the isolation are appropriate for the switching operation up to 2.5 GHz.

Figure 7A:
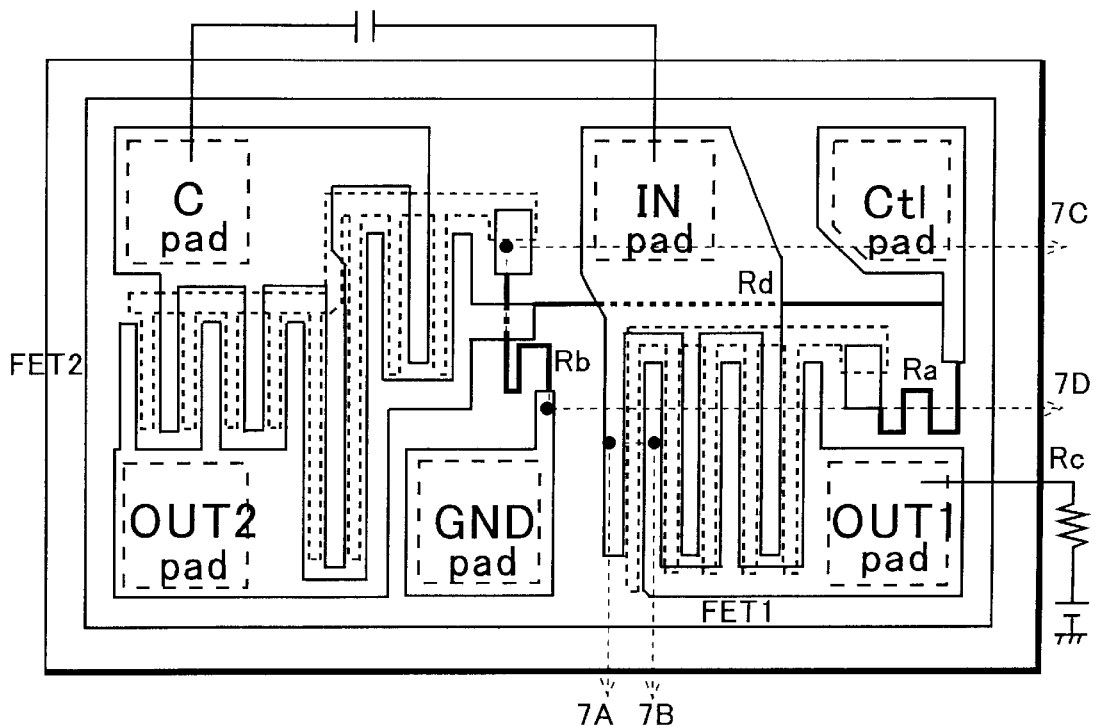
FIG. 7A is a plan view of a switching device integrated as a chip of the first embodiment.
Figure 7B:
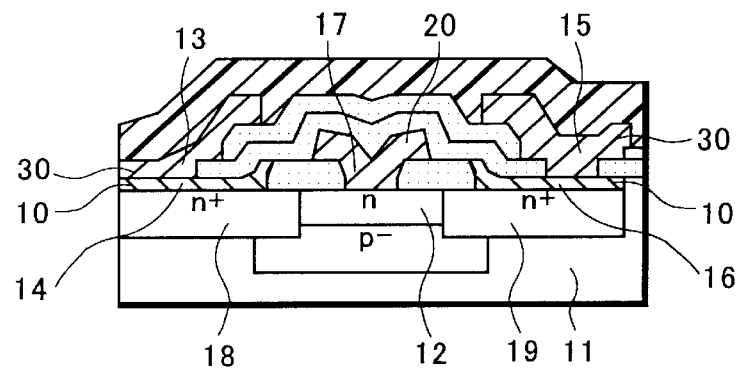
FIG. 7B is a partial cross-sectional view of the transistor of FIG. 7A.

FIG. 7A is an example of a semiconductor switching device integrated as a compound semiconductor chip, based on the first embodiment of FIG. 2. FIG. 7B is a partial cross-sectional view of the chip of FIG. 7A cut along a line connecting points 7A and 7B of FIG. 7A perpendicularly to the channel layer of the FET. The two switching FETs (FET1 on the right, FET2 on the left) occupies the central portion of a GaAs substrate. An isolation terminal pad Cpad for connecting to a direct current isolation element, which is a capacitor CA in this embodiment, the common input terminal pad INpad and the control terminal pad Ctlpad are aligned along the upper edge of the substrate. The first and second output terminal pads OUT1pad, OUT2pad and a ground terminal pad GNDpad for grounding FET2 are aligned along the lower edge of the substrate. The bias element for FET1 and the capacitor CA are externally connected to the chip as shown in FIG. 7A. The capacitor is inserted between the isolation terminal pad Cpad and the common input terminal pad INpad, and the bias element is connected to the first output terminal pad OUT1pad. The dashed lines indicate a second layer of wiring which is formed in the same processing step as the gate electrodes of the FET and is made of a gate metal layer (Ti/Pt/Au) 20. A third layer of wiring indicated by the solid lines is for connecting the device elements and forming the terminal pads, and is made of a pad metal layer (Ti/Pt/Au) 30. A first layer contains an ohmic metal layer (AuGe/Ni/Au) 10 making an ohmic contact with the substrate, which forms the source electrode, the drain electrode and electrodes for the resistors. In FIG. 7A, the first layer is not shown, as it overlaps with the pad metal layer.

In FIG. 7A, the broken-line rectangles encircling the labels for the terminal pads (Cpad, INpad, Ctlpad, OUT2pad, GNDpad and OUT1pad) denote the gate metal layer 20, which is underneath the pad metal layer 30. However, these rectangles approximately correspond to the areas of the pad metal layer 30 to which a bonding wire is attached as described later with reference to FIG. 8A. These areas substantially correspond to the respective terminal pads.

FIG. 7B shows the placement of the three metal layers 10, 20, 30. The GaAs substrate 11 has an n-type channel region 12, and two heavily doped regions at both ends of the channel region 12, namely, a source region 18 and a drain region 19. The gate electrode 17, which is made of the gate metal layer 20 as the second metal layer, is formed on the surface of the channel region 12. The first layer source electrode 14 and the first layer drain electrode 16, which are made of the ohmic metal layer 10 as the first metal layer, are formed on the surface of the heavily doped regions. On top of the first-layer source and drain electrodes 14, 16 is formed the third layer source and drain electrode made of the pad metal layer 30 as the third metal layer, namely the third layer drain electrode 15 and the third layer source electrode 13. This layer is responsible for wiring the device elements of the chip.

The common input terminal pad INpad is connected to the source electrode (or the drain electrode) of FET1, and is connected to the source electrode (or the drain electrode) of FET2 via a capacitor. The drain electrode (or the source electrode) of FET1 is connected to the output terminal pad OUT1pad, and the drain electrode (or the source electrode) of FET2 is connected to the output terminal OUT2pad. The control terminal pad Ctlpad is connected to FET1 and FET2 with resistor Rd connecting the control terminal pad Ctlpad to the drain electrode (or the source electrode) of FET2. The gate electrode of FET2 is connected the ground terminal pad GNDpad via resistor Rb for grounding. The isolation terminal pad Cpad is connected to the source electrode (or the ground electrode) of FET2, and the direct current isolation element, which is a capacitor in this embodiment, is externally connected to the chip using the isolation terminal pad Cpad and the common input terminal INpad.

The six terminal pads described above occupy significant area of the chip surface, as shown in FIG. 7A. Each of the terminal pads needs a predetermined area for wire bonding, and it is not appropriate to reduce the size of the terminal pad for reducing overall chip size. Accordingly, it is required that other device elements including the two FETs and the resistors be arranged in order to save space for chip size reduction. The chip of this embodiment has the isolation terminal pad Cpad, the common input terminal pad INpad and the control terminal pad Ctlpad aligned in this order along one edge of the chip, and has first output terminal pad OUT1pad, ground terminal pad GNDpad and the second output terminal pad OUT2 aligned in this order along other edge of the chip. A portion of FET2 is formed between the isolation terminal pad Cpad and the second output terminal pad OUT2pad, and a portion of FET1 is formed in the space surrounded by the common input terminal pad INpad, the first output terminal pad OUT1 and the ground terminal pad GNDpad.

The configuration described above is effective in utilizing the spaces between the terminal pads by placing resistors Ra, Rb, Rd and portions of FETs in those spaces. Accordingly, this embodiment provides a switching circuit device with one control terminal pad, or one pin for the control signal when the chip is housed in a package, without increasing overall chip size. Furthermore, in this configuration, FET1 and FET2 are isolated from each other by the ground terminal pad GNDpad. This prevents the leaking of high frequency signal from the common input terminal pad INpad to the output terminal pads OUT1pad, OUT2pad via FET1 and FET2.

The bias element is, as is the case with the direct current isolation element, externally connected to the chip using the first output terminal pad OUT1.

In this embodiment, the distance between the control terminal pad Ctlpad and the drain electrode (or the source electrode) of FET2 is long. Application of conventional wiring design in which the crossing between the wire lines is avoided would increase overall ship size because detouring of wiring line needs additional space. The following measures are taken in this embodiment to avoid overall chip size increase.

The first is to place the first connection, which is resistor Rd, under the portion of the pad metal layer 30 which extends from the common input pad INpad and connects to the source electrode (or the drain electrode) of FET1. The connection runs along the edges of the control terminal pad Ctlpad and the common input terminal pad INpad, which face FET1. Accordingly, the connection between the control terminal pad Ctlpad and the drain electrode (or the source electrode) of FET2 does not need any additional space for its placement because of this intersecting design, and does not contribute to overall chip size increase.

The second is to place the second connection, which is resistor Rb, in the central portion of the chip. This connection, which connects the gate electrode of FET2 and the ground terminal pad GNDpad, is bent so that the connection is accommodated in the space surrounded by FET1, FET2 and the ground terminal pad GNDpad. This intersecting configuration is achieved by placing a portion of the connection under the portion of the drain electrode (or the source electrode) of FET2 which meets with the resistor Rd above. This is a much better configuration than the conventional configuration in which the connection is detoured around the edge portion of the chip so as to avoid the intersecting wiring configuration.

Figure 7C:
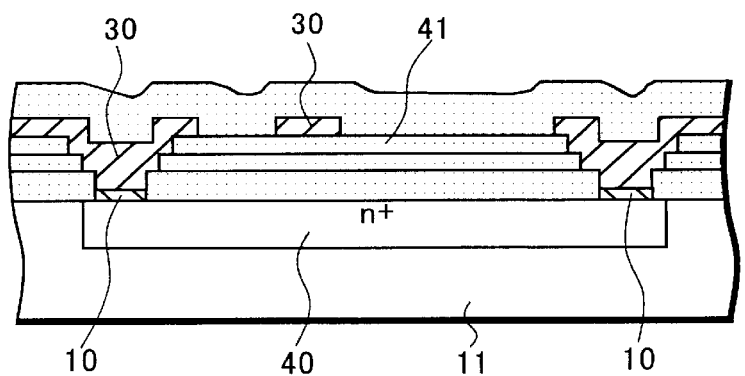
FIG. 7C is a partial cross-sectional view of the central portion of the device of FIG. 7A.

The intersecting configuration is achieved by the multilayer wiring structure shown in FIG. 7C, which is a pseudo-cross-sectional view cut along the resistor Rb between points 7C and 7B of FIG. 7A. Although FIG. 7C is to describe the structure of the connection for grounding, Rb, under the drain electrode (or the source electrode) of FET2, similar structure applies to the intersection of the first connection, Rd. The connection Rb is an $n^+$ type high impurity region 40 which is formed on a substrate 11 by an ion injection process at the time of forming source and drain regions on the substrate 11. The ohmic metal layer 10, which is the first layer, is formed on the $n^+$ type high impurity region 40 at its both ends. Other upper surface of the $n^+$ type high impurity region 40 is covered by a nitride film 41. The pad metal layer 30, which is the third layer, is formed on top of the ohmic metal layer 10 at the time of forming the drain electrode 18 (or source electrode) of FET2. Accordingly, resistor Rb is insulated from the drain electrode 18 of FET2 by the nitride film 41, resulting in the intersecting configuration.

Figure 8A:
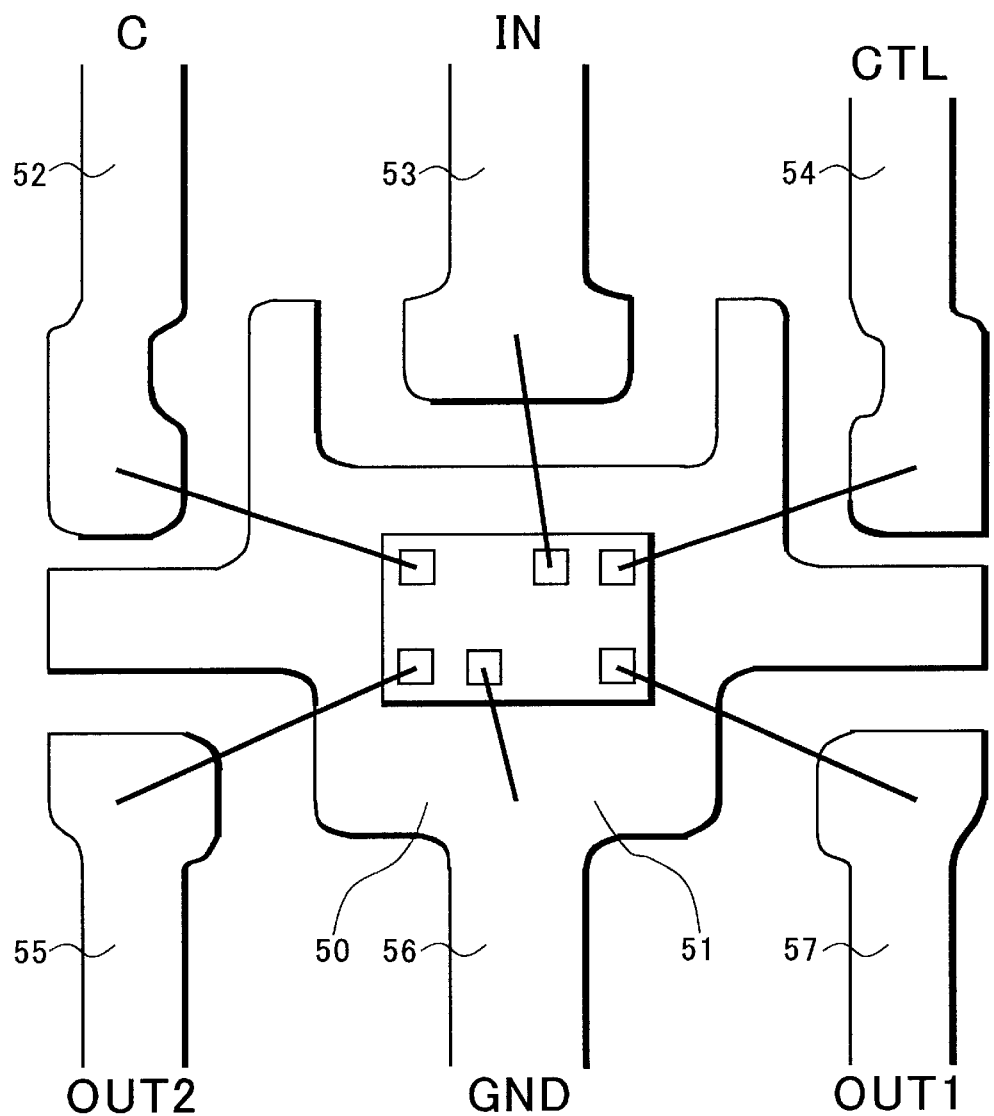
FIG. 8A is a schematic plan view of the device of FIG. 7A mounted on a header inside a housing of a package for the device.

FIG. 8A shows an example in which the chip shown in FIG. 7A is mounted on a lead frame for packaging. The lead frame with a six-pin configuration has a header 50 located in the middle of the frame on which the compound semiconductor chip 51 is mounted. The chip 51 is the same chip shown in FIGS. 7A, 7B and 7C, and the six terminal pads are indicated by the small rectangles on the chip. Although the rectangles are not labeled with any specific name, the configuration of the six terminal pads are the same as that of FIG. 7. The three leads 52, 53, 54 on the upper side of the figure are connected by wire bonding to the isolation terminal pad Cpad, the common input terminal pad INpad and the control terminal pad Ctlpad, respectively. Three more leads 55, 56, 57 on the bottom side of the figure are connected by wire bonding to the second output terminal pad OUT2pad, ground terminal pad GNDpad and the first output terminal pad OUT1pad, respectively. The lead 56 at the bottom center is connected to the header 50. The header 50 extends into the space between the leads, i.e. between 52 and 53, between 53 and 54, between 52 and 55, between 54 and 57, and between 55 and 57. This configuration assures the signal separation between the leads.

The lead 56 connected to the ground terminal pad GNDpad is always grounded, and the lead 54 connected to the control terminal pad Ctlpad is substantially grounded in terms of high frequency signal since only DC signal is applied to the control terminal pad Ctlpad. These two leads, or DC pins, assures enough separation between the lead 53 forming a common input pin IN and the lead 57 forming a first output pin OUT1, between the lead 53 forming a common input pin IN and the lead 55 forming a second output pin OUT2, and between the lead 57 forming a first output pin OUT1 and the lead 55 forming a second output pin OUT2.

Figure 8B:
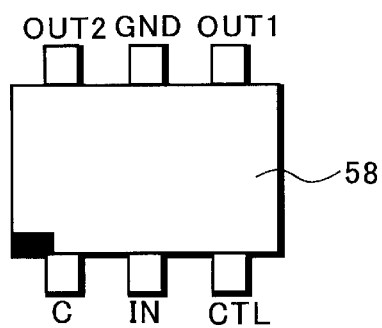
FIG. 8B shows a plan view of the package.

In this embodiment, the chip is covered by a resin layer 58 formed by transfer molding with the six pins C, IN, CTL, OUT2, GND, OUT1 extruding from the packaging, as shown in FIG. 8B. This type of packaging is called MCP6, and has a dimension of 2.0 mm×1.25 mm×0.9 mm.

This embodiment is not limited to a lead frame configuration. It is applicable to a lead structure formed on an insulating plate including ceramics and the like using conducting paste and the like. It is also applicable to a lead structure formed on a printed circuit board using copper foils and the like, resulting in a bare chip configuration.

Furthermore, resistor Rc of the bias element, which applies a bias voltage to FET1, may be formed on the chip as well as a bias terminal pad $V_{DD}$pad for connecting to a power source of the bias element. In this variation of the first embodiment, the resistor Rc is connected to the first output terminal pad OUT1pad, it may be connected to the common input terminal pad INpad, as described below with reference to FIGS. 10E and 10F.

Figure 9:
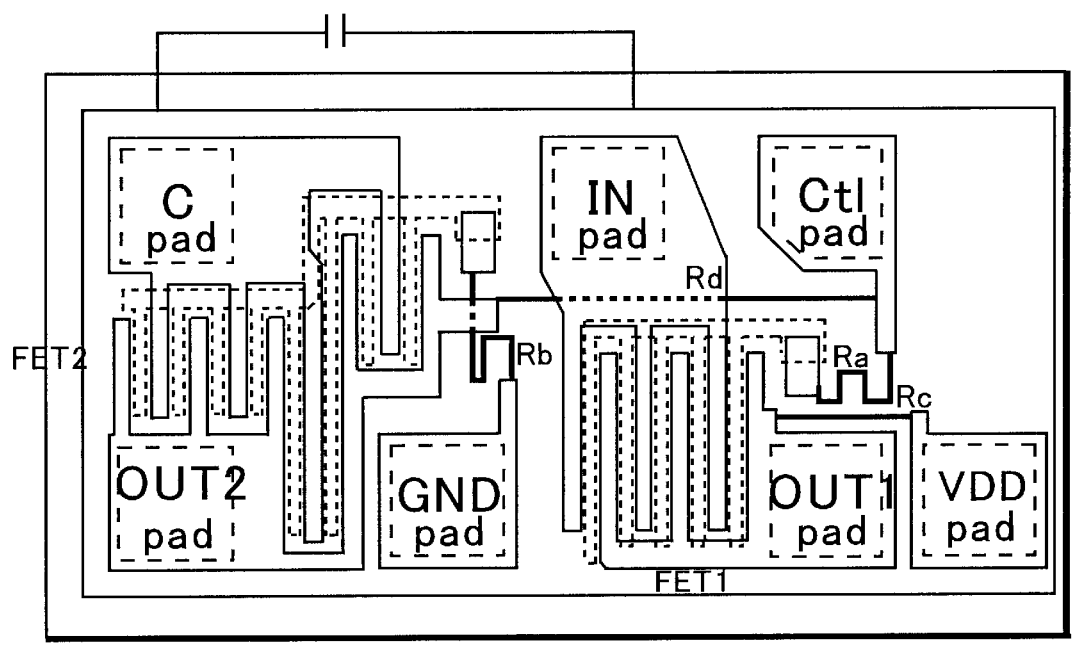
FIG. 9 shows a variation of the first embodiment in which a resistor for the bias element is integrated in the chip.

FIGS. 10A–10F show variations of the first embodiment. These are schematic drawings showing the relative positions on the chip of the terminal pads and the related wirings including the resistors. For simplicity, FETs and resistors are represented by their respective symbols rather than actual two dimensional configurations. For example, the chip configuration shown in FIG. 7A is identical to the chip configuration shown in FIG. 10A, and that of FIG. 9 is identical to that of FIG. 10C. All the variations of the first embodiment are effective in overall chip size reduction.

Figure 10A:
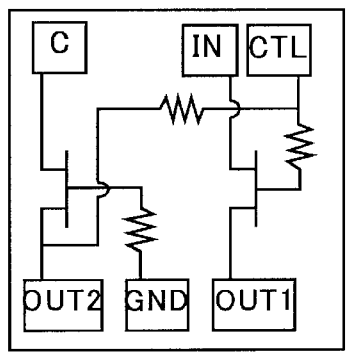
FIGS. 10A–10F show variations of the first embodiment of this invention.
Figure 10B:
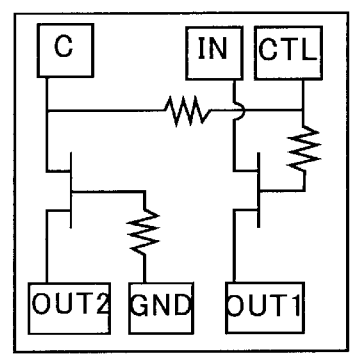
Figure 10C:
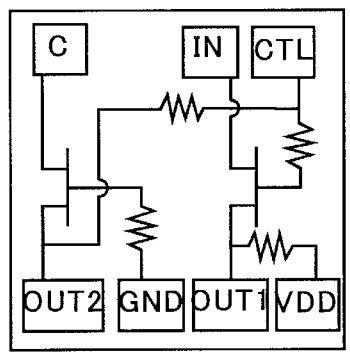
Figure 10D:
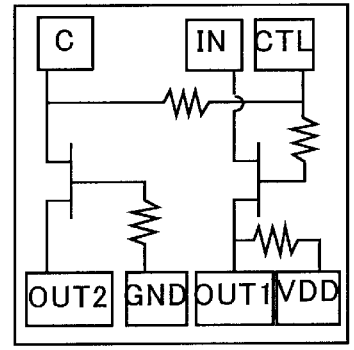
Figure 10E:
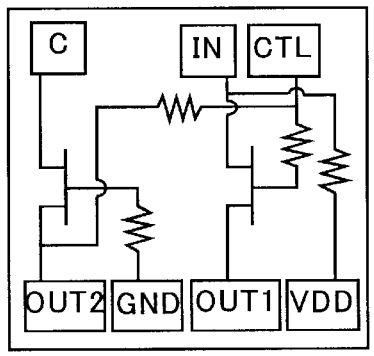
Figure 10F:
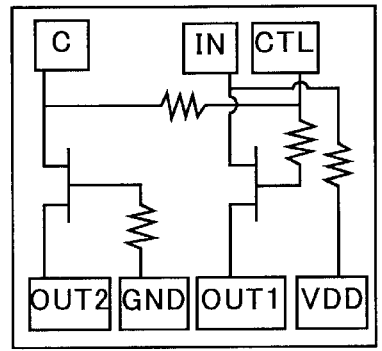

The chip configuration of FIG. 10A is identical to that of FIG. 7A, and the capacitor CA and the whole bias element including resistor Rc and the power source are externally connected to the chip. As a variation, the connection Rd extending from the control terminal pad Ctlpad connects with FET2 at its source side (or the drain side) which is not connected to the second output terminal pad OUT2pad (FIG. 10B). The resistor Rc of the bias element may be integrand into the chip with the option of applying the control signal either on the drain side of FET2 (FIG. 10C) or on the source side (FIG. 10D). The resistor Rc may be connected to the common input terminal pad INpad, rather than the first output terminal pad OUT1, with the option of applying the control signal either on the drain side of FET2 (FIG. 10E) or on the source side (FIG. 10F).

Figure 11A:
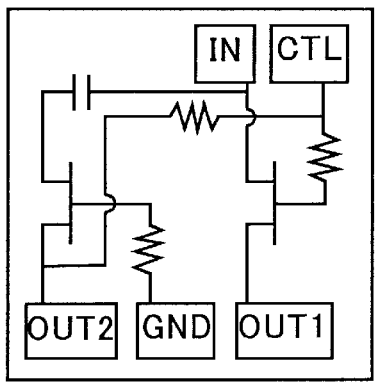
FIGS. 11A–11F show variations of a second embodiment of this invention.
Figure 11B:
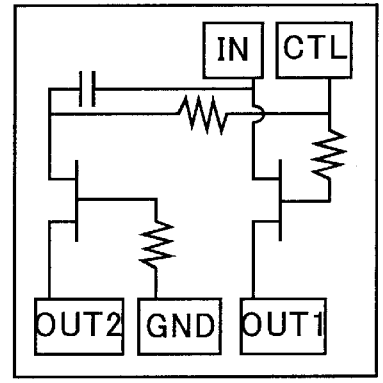
Figure 11C:
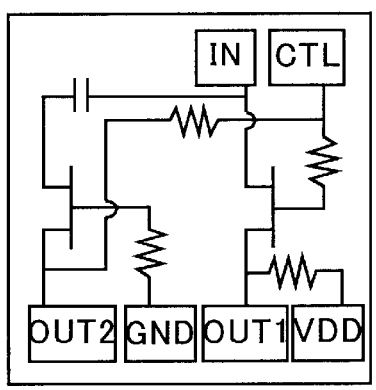
Figure 11D:
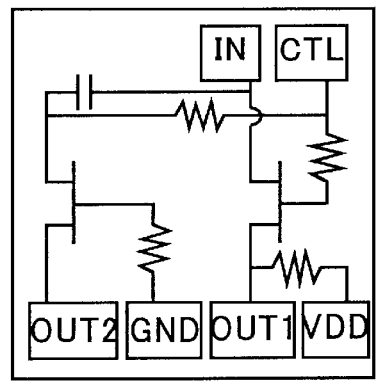
Figure 11E:
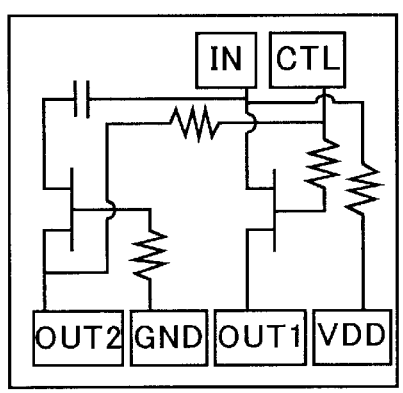
Figure 11F:
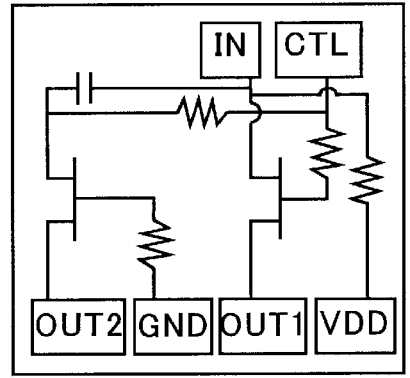

A second embodiment of this invention is shown in FIG. 11A, in which the direct current isolation element, CA, is integrated into the chip with other device elements being disposed in a configuration similar to the configuration of the first embodiment shown in FIG. 10A. This configuration does increase overall chip size for accommodating the capacitor, but has its merit in eliminating the pin C for the isolation element. This type of device may be best used when devise design allows a larger package size. As a variation, the connection Rd extending from the control terminal pad Ctlpad connects with FET2 at its source side (or the drain side) which is not connected to the second output terminal pad OUT2pad (FIG. 11B). The resistor Rc of the bias element may be integrated into the chip with the option of applying the control signal either on the drain side of FET2 (FIG. 11C) or on the source side (FIG. 11D). The resistor Rc may be connected to the common input terminal pad INpad, rather than the first output terminal pad OUT1, with the option of applying the control signal either on the drain side of FET2 (FIG. 11E) or on the source side (FIG. 11F).

The above embodiments provide SPDT semiconductor switching circuit devices based on GaAs FETs which operate with just one control terminal without employing inverter circuits. Elimination of the external electrodes for the inverter circuits results in a simple package design and small occupancy of printed circuit boards. The energy consumption of this switching device is smaller than a device with inverter circuits.

Either a predetermined positive voltage or zero voltage is applied to the single control terminal for the switching operation. Thus, only one power source of positive voltage is required. There is no need for a negative voltage generating circuit which is required for operating GaAs FETs of conventional design. The insertion loss and isolation characteristics are substantially the same as the device with two control terminals.

Although ground terminal pad GNDpad and capacitor terminal pad Cpad are required in the embodiments, the increase of chip area due to these additional terminal pads is compensated for by reducing the number of the control terminals to one. Accordingly, the chip size of the embodiments of this invention is substantially the same as the conventional switching device. However, the switching device with one control terminal is very easy to handle when it is assembled into a host device, and thus helps simplifying production process.

Although the connection Rd between the control terminal pad Ctlpad and FET2 is long, the connection is disposed between FET1 and the row of the common input terminal pad INpad and the control terminal pad Ctlpad, and does not require detouring of wiring around the chip edge because of the intersecting structure between the resistor Rd and the metal layer connecting the common input terminal pad INpad and the source electrode of FET1. This configuration avoids overall size increase of the device. The connection Rb for grounding FET2 is confined to the central area of the chip, further contributing to the chip size reduction. This configuration is also made possible by the intersecting structure between the resistor Rb and a portion of the drain electrode of FET2.

Further advantage of these embodiments is that the chip with one control terminal pad Ctlpad can be housed in the same six-pin package as the chip with two control terminal pads. In such a case, the pin for the second control signal is used as the pin for the isolation terminal pad Cpad.

The leads for the GND pin and the Ctl pin, which are substantially grounded in terms of high frequency signals, assures isolation between the lead of IN pin and the lead of the OUT1 pin, between the lead of IN pin and the lead of the OUT2 pin, and between the lead of the OUT1 pin and the lead of the OUT2 pin.

The above is a detailed description of particular embodiments of the invention. It is recognized that departures from the disclosed embodiments may be made within the scope of the invention and that obvious modifications will occur to a person skilled in the art. The full scope of the invention is set out in the claims that follow and their equivalents. Accordingly, the specification should not be construed to narrow the full scope of protection to which the invention is entitled.

What is claimed is:

1. A switching circuit device comprising:
   a common input terminal pad;
   a first output terminal pad and a second output terminal pad;
   a first switching element connected to the common input terminal pad and the first output terminal pad;
   a second switching element connected to the common input terminal pad and the second output terminal pad;
   a control terminal pad connected to the first switching element and receiving a control signal for the switching device;
   a first connection connecting the control terminal pad to the second switching element;
   a second connection connecting the second switching element to a ground;
   a ground terminal pad for the second connection;
   a direct current isolation element interrupting a direct current between the second switching element and the common input terminal pad; and
   a bias element applying a bias voltage to the first switching element.

2. The switching circuit device of claim 1, wherein the first connection comprises a resistor and is disposed along the common input terminal pad and the control terminal pad.

3. The switching circuit device of claim 2, wherein the resistor comprises a high impurity concentration region formed on a substrate on which the first switching element and the second switching element are formed, and wherein the resistor intersects a metal layer extending from the common input terminal pad.

4. The switching circuit device of claim 1, wherein the bias element comprises a resistor and a power source, the first switching element and the second switching element are integrated into a chip, and the resistor and a bias terminal pad for the resistor are integrated into the chip.

5. The switching circuit device of claim 1, wherein the first switching element and the second switching element are integrated into a chip, and wherein the direct current isolation element is externally connected to the chip via an isolation terminal pad.

6. The switching circuit device of claim 1, wherein the second connection comprises a resistor and is disposed in a central portion of the switching circuit device.

7. The switching circuit device of claim 6, wherein the resistor comprises a high impurity concentration region formed on a substrate on which the first switching element and the second switching element are formed, and wherein the resistor intersects a portion of the second switching element.

8. A semiconductor switching device comprising:
a first field effect transistor and a second field effect transistor each comprising a source electrode, a gate electrode and a drain electrode which are formed on a channel layer of the respective transistor;
a common input terminal pad connected to the source electrode or the drain electrode of the first transistor and connected to the source electrode or the drain electrode of the second transistor;
a first output terminal pad connected to the source electrode or the drain electrode of the first transistor which is not connected to the common input terminal pad;
a second output terminal pad connected to the source electrode or the drain electrode of the second transistor which is not connected to the common input terminal pad;
a control terminal pad connected to the first transistor and the second transistor;
a first connection connecting the control terminal pad to the second transistor;
a second connection connecting the gate electrode of the second transistor to a ground;
a ground terminal pad for the second connection;
an direct current isolation element interrupting a direct current between the second transistor and the common input terminal pad;
an isolation terminal pad, the direct current isolation element being connected to the isolation terminal pad; and
a bias element applying a bias voltage to the first transistor;
wherein the first transistor and the second transistor are integrated into a chip, the isolation terminal pad, the common input terminal pad and the control terminal pad are disposed along an edge of the chip, and the first output terminal pad, the second output terminal pad and the ground terminal pad are disposed along an edge opposite to the edge with the isolation terminal pad, the common input terminal pad and the control terminal pad so that the ground terminal pad is located between the two output terminal pads.

9. The switching circuit device of claim 8, wherein the bias element comprises a resistor and a power source, the first transistor and the second transistor are integrated into a chip, and the resistor and a bias terminal pad for the resistor are integrated into the chip.

10. The switching circuit device of claim 8, further comprising a package housing including a header and a plurality of leads, wherein the chip is mounted on the header connected to a lead to which the ground terminal pad is connected, and the isolation terminal pad, the common input terminal pad, the control terminal pad, the first output terminal pad and the second output terminal pad are connected to corresponding leads.

11. The switching circuit device of claim 10, wherein the plurality of leads are disposed so that relative positioning of the terminal pads are maintained among the corresponding leads.

12. The switching circuit device of claim 10, wherein the lead connected to the common input terminal pad, the lead connected to the first output terminal pad and the lead connected to the second output terminal pad are isolated from each other in terms of high frequency signals by the lead connected to the control terminal pad and the lead connected to the ground terminal pad and the header.

13. A semiconductor switching device comprising:
a first field effect transistor and a second field effect transistor each comprising a source electrode, a gate electrode and a drain electrode which are formed on a channel layer of the respective transistor;
a common input terminal pad connected to the source electrode or the drain electrode of the first transistor and connected to the source electrode or the drain electrode of the second transistor;
a first output terminal pad connected to the source electrode or the drain electrode of the first transistor which is not connected to the common input terminal pad;
a second output terminal pad connected to the source electrode or the drain electrode of the second transistor which is not connected to the common input terminal pad;
a control terminal pad connected to the gate electrode of the first transistor, said control terminal receiving a control signal for the switching device;
a first connection connecting the control terminal pad to the source electrode or the drain electrode of the second transistor;
a second connection connecting the gate electrode of the second transistor to a ground;
a ground terminal pad for the second connection;
a direct current isolation element interrupting a direct current between the second transistor and the common input terminal pad; and
a bias element applying a bias voltage to the first transistor.

14. The switching circuit device of claim 13, wherein the first connection comprises a resistor and is disposed along the common input terminal pad and the control terminal pad.

15. The switching circuit device of claim 14, wherein the resistor comprises a high impurity concentration region formed on a substrate on which the first transistor and the second transistor are formed, and wherein the resistor intersects a metal layer extending from the common input terminal pad.

16. The switching circuit device of claim 13, wherein the bias element comprises a resistor and a power source, and the first transistor and the second transistor are integrated into a chip, and wherein the resistor and a bias terminal pad for the resistor are integrated into the chip.

17. The switching circuit device of claim 13, wherein the first transistor and the second transistor are integrated into a chip, and wherein the direct current isolation element is externally connected to the chip via an isolation terminal pad.

18. The switching circuit device of claim 13, wherein the first transistor and the second transistor are integrated into a chip, the direct current isolation element, the common input terminal pad and the control terminal pad are disposed along an edge of the chip, and the first output terminal pad, the second output terminal pad and the ground terminal pad are disposed along an edge opposite to the edge with the isolation element, the common input terminal pad and the control terminal pad so that the ground terminal pad is located between the two output terminal pads.

19. The switching circuit device of claim 13, wherein the second connection comprises a resistor and is disposed in a central portion of the switching circuit device.

20. The switching circuit device of claim 19, wherein the resistor comprises a high impurity concentration region formed on a substrate on which the first transistor and the second transistor are formed, and the resistor intersects the source electrode or the drain electrode of the second transistor.

21. A circuit device which cooperates with an external direct current isolation element and an external bias element to work as a switch, comprising:

a common input terminal pad;
   a first output terminal pad and a second output terminal pad;
   a first switching element connected to the common input terminal pad and the first output terminal pad;
   a second switching element connected to the common input terminal pad and the second output terminal pad;
   a control terminal pad connected to the first switching element and receiving a control signal for switching the first switching element and the second switching element;
   a first connection connecting the control terminal pad to the second switching element;
   a second connection connecting the second switching element to a ground;
   a ground terminal pad for the second connection; and
   an isolation terminal pad connected to the second switching element;
   wherein the direct current isolation element is connected to the common input terminal pad and the isolation terminal pad, and the bias element is connected to the common input terminal pad or the first output terminal pad.

22. The circuit device of claim 21, wherein the direct current isolation element comprises a capacitor.

23. A circuit device which cooperates with an external bias element to work as a switch, comprising:

a common input terminal pad;
   a first output terminal pad and a second output terminal pad;
   a first switching element connected to the common input terminal pad and the first output terminal pad;
   a second switching element connected to the common input terminal pad and the second output terminal pad;
   a control terminal pad connected to the first switching element and receiving a control signal for switching the first switching element and the second switching element;
   a first connection connecting the control terminal pad to the second switching element;
   a second connection connecting the second switching element to a ground;
   a ground terminal pad for the second connection; and
   a direct current isolation element interrupting a direct current between the second switching element and the common input terminal pad;
   wherein the bias element is connected to the common input terminal pad or the first output terminal pad.

24. The circuit device of claim 23, wherein the direct current isolation element comprises a capacitor.

25. A circuit device which cooperates with an external direct current isolation element and an external bias power source to work as a switch, comprising:

a common input terminal pad;
   a first output terminal pad and a second output terminal pad;
   a first switching element connected to the common input terminal pad and the first output terminal pad;
   a second switching element connected to the common input terminal pad and the second output terminal pad;
   a control terminal pad connected to the first switching element and receiving a control signal for switching the first switching element and the second switching element;
   a first connection connecting the control terminal pad to the second switching element;
   a second connection connecting the second switching element to a ground;
   a ground terminal pad for the second connection;
   an isolation terminal pad connected to the second switching element;
   a bias terminal pad connected to the first switching element; and
   a resistor connected to the bias terminal pad and the first switching element;
   wherein the direct current isolation element is connected to the common input terminal pad and the isolation terminal pad, and wherein the bias terminal pad is connected to the bias power source.

26. The circuit device of claim 25, wherein the direct current isolation element comprises a capacitor.

* * * * *